(12) United States Patent
Yu

(10) Patent No.: US 6,865,079 B2
(45) Date of Patent: Mar. 8, 2005

(54) COOLING FAN

(75) Inventor: Shou-Te Yu, Taipei Hsien (TW)

(73) Assignee: Asia Vital Components Co., Ltd., Kaohsiung (TW)

(*) Notice: Subject to any disclaimer, the term of this patent is extended or adjusted under 35 U.S.C. 154(b) by 0 days.

(21) Appl. No.: 10/634,956

(22) Filed: Aug. 6, 2003

(65) Prior Publication Data

US 2005/0030713 A1 Feb. 10, 2005

(51) Int. Cl.[7] .............................................. H05K 7/20
(52) U.S. Cl. ....................... 361/697; 361/695; 257/722; 174/16.3; 165/80.3; 165/121
(58) Field of Search ................. 361/695, 697, 361/704, 719; 257/722, 727; 174/16.1, 16.3; 165/80.3, 122, 185; 415/277, 213.1

(56) References Cited

U.S. PATENT DOCUMENTS 6,650,111 B2 * 11/2003 Christensen ........... 324/207.26
6,654,246 B2 * 11/2003 Wu ............................. 361/697
2002/0170703 A1 * 11/2002 Huang et al. .............. 165/80.3
2003/0137807 A1 * 7/2003 Chen ........................... 361/697

* cited by examiner

Primary Examiner—Boris Chervinsky
(74) Attorney, Agent, or Firm—Bacon & Thomas PLLC

(57) ABSTRACT

A cooling fan device for mounting on top of parallel radiation fins of a radiator. The device includes a seat having a driving section, and an air-guiding fan pivotally connected to the driving section of the seat and including a hub and blades generally radially spaced around an outer periphery of the hub. Supporting sections are extended from two opposite sides of the driving section in directions parallel with the radiation fins of the radiator to support the driving section in the seat. With the supporting section in parallel with the radiation fins, flowing air produced by the air-guiding fan is allowed to flow toward the radiator without hindrance.

4 Claims, 6 Drawing Sheets

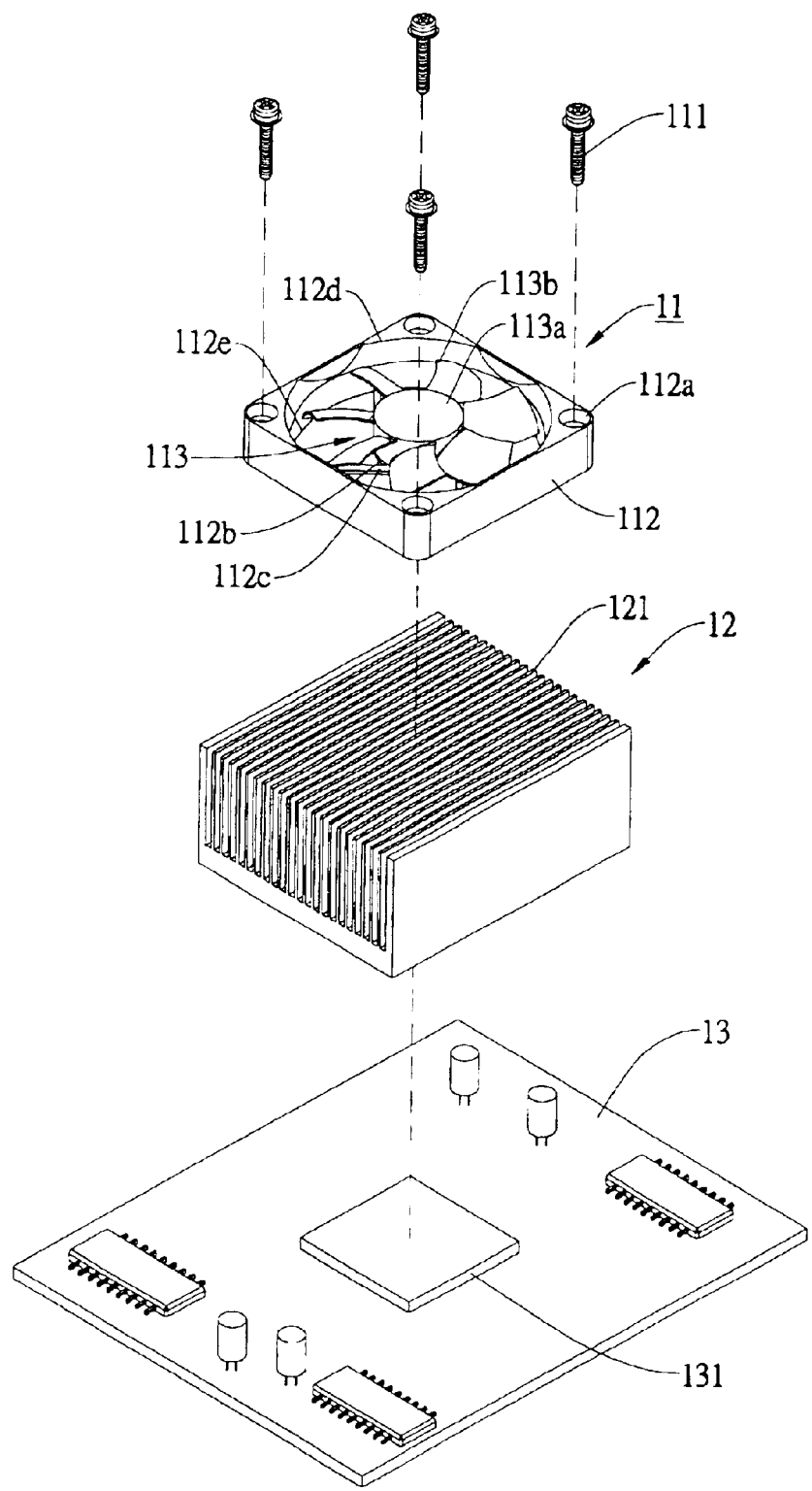
PRIOR ART FIG.1

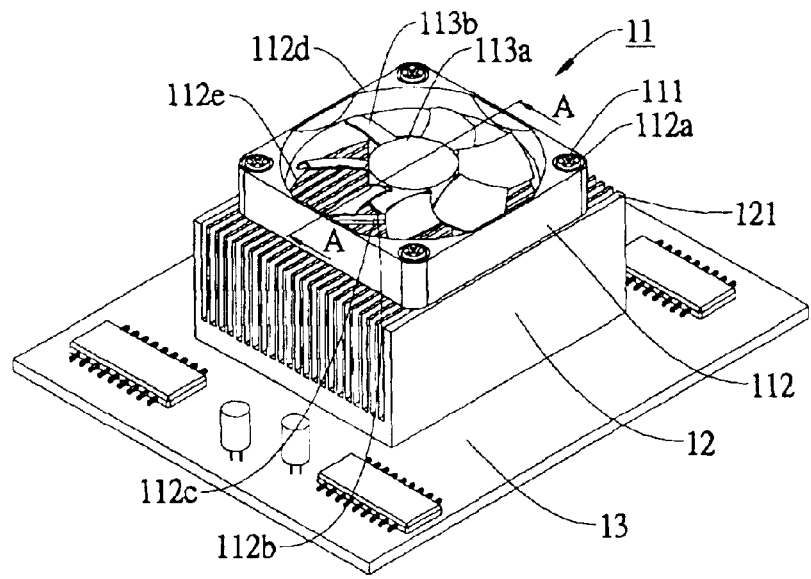
PRIOR ART FIG.2
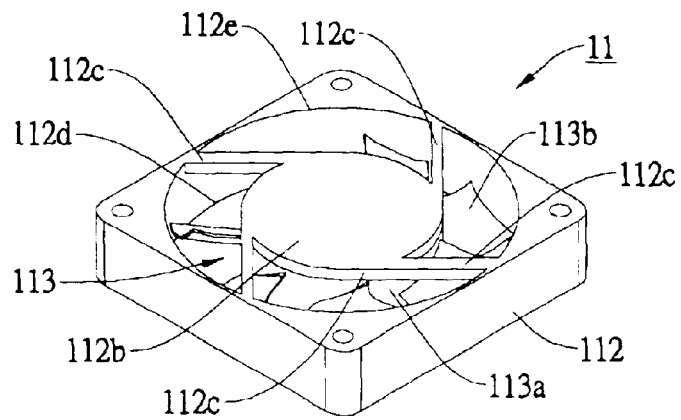
PRIOR ART FIG.3
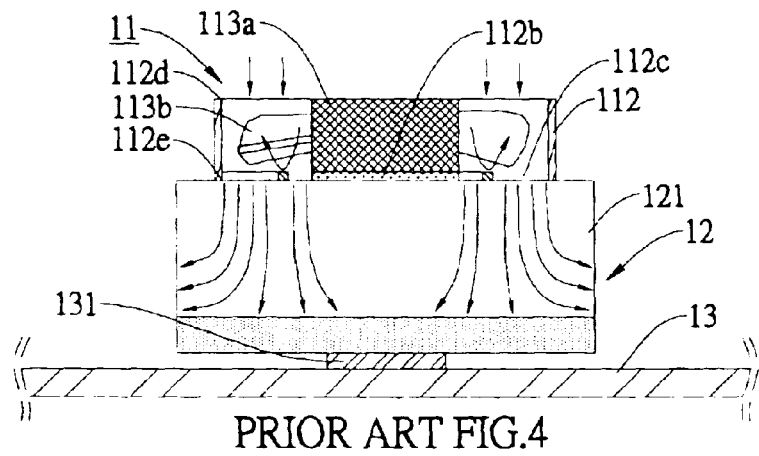
PRIOR ART FIG.4

COOLING FAN

FIELD OF THE INVENTION

The present invention relates to a cooling fan, and more particularly to a cooling fan for mounting on a top of a radiator to produce flowing air while enables reduced air resistance and noises.

BACKGROUND OF THE INVENTION

With the wide application of computers and the rapid development of information and related industries, the currently available central processing unit or chip for computers has a surprisingly high operation speed. However, the extremely high-speed central processing unit or chip also produces very large amount of heat during its operation. The produced heat would seriously adversely affect the stable performance of the central processing unit or the chip, if it were not properly and timely radiated or dissipated. A common practice for the information and other related industries to solve this problem is to mount a radiator on a top of the central processing unit or the chip and a cooling fan on the radiator to enable quick dissipation of heat produced by the central processing unit or the chip.

Most of the current radiators are made of an aluminum alloy material that has low material cost and provides relatively good thermal conducting effect when compared with other materials. Therefore, other available materials are used to make the radiators only in a few special cases. Under this condition, the best way to carry away the heat transferred to the radiator is to increase as much as possible the contact area between the radiator and the surrounding air. A radiator having a large volume could only slow the rising of temperature thereof when it has only a small contact area with the surrounding air.

FIGS. 1 to 4 shows a conventional cooling fan 11 for mounting on a plurality of parallel radiation fins 121 of a radiator 12. As shown, the cooling fan 11 mainly includes a seat 112 having mounting holes 112a provided at predetermined positions thereon, and an air-guiding fan 113 pivotally connected to the seat 112. The seat 112 includes a centered driving section 112b and a plurality of supporting sections 112c extended between the centered driving section 112b and the seat 112. The air-guiding fan 113 includes a hub 113a and a plurality of blades 113b generally radially spaced around an outer periphery of the hub 113a.

The cooling fan 11 is connected to the top of the radiation fins 121 of the radiator 12 by screwing fastening elements 111, such as screws, into the mounting holes 112a on the seat 112. The radiator 12 is then caused to closely bear against a chip 131 mounted on a circuit board 13, and finally assembled to the circuit board 13.

When the driving section 112b drives the air-guiding fan 113 to rotate, air in the space above and surrounding the cooling fan 11 is brought to move into an air inlet 112d of the seat 112 and out of an air outlet 112e of the seat 112. Since the supporting sections 112c are normally radially extended from the driving section 112b to locate between the driving section 112b and the air outlet 112e of the seat 112 and cross with the parallelly arranged radiation fins 121 of the radiator 12, they prevent the air flown out of the seat 112 from smoothly flowing toward the radiator 12, resulting in reduced airflow that could reach at the radiator 12 and reduced contact area of the radiator 12 with surrounding air. Since the produced heat is carried away by air, the reduced airflow produced by the cooling fan 11 would decrease the contact area between the radiator and the air to result in poor radiating effect. Even a high-power or a high-speed cooling fan would not be able to satisfactorily radiate heat produced by the chip 131 on the circuit board 13 when the cooling fan 11 does not effectively increase the contact area between the radiator and surrounding air. In this case, the high-power or high-speed cooling fan would only produce the problems of large noises and high manufacturing cost.

It is therefore tried by the inventor to develop a cooling fan that eliminates the drawbacks existed in the conventional cooling fans.

SUMMARY OF THE INVENTION

A primary object of the present invention is to provide a cooling fan that may reduce air resistance and increase a contact area of a radiator with surrounding air.

Another object of the present invention is to provide a cooling fan that may reduce noises possibly produced during operation of the cooling fan.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 1 is an exploded perspective view showing the relation of a conventional cooling fan with the radiation fins and circuit board in a computer;

FIG. 2 is an assembled perspective view of FIG. 1;

FIG. 3 is a bottom perspective view of the conventional cooling fan of FIG. 1;

FIG. 4 is a sectional view taken along line A—A of FIG. 2;

DETAILED DESCRIPTION OF THE PREFERRED EMBODIMENTS

Figure 5:
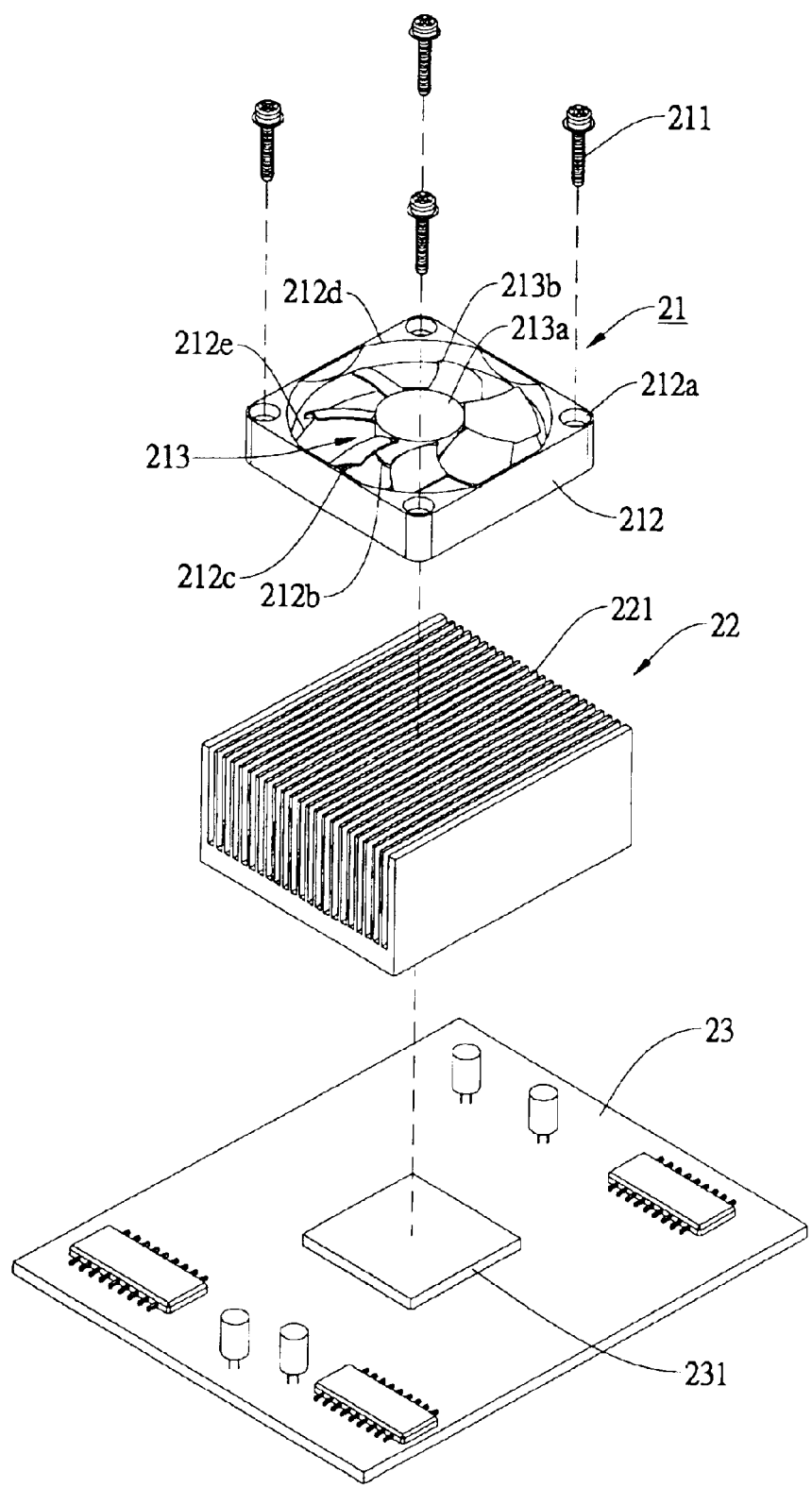
FIG. 5 is an exploded perspective view showing the relation of a cooling fan according to a first embodiment of the present invention with radiation fins and circuit board of a computer.
Figure 6:
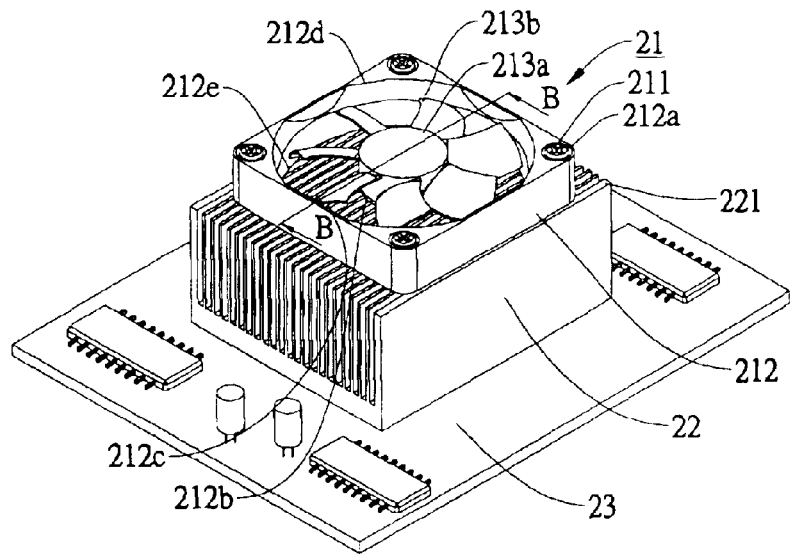
FIG. 6 is an assembled perspective view of FIG. 5.
Figure 7:
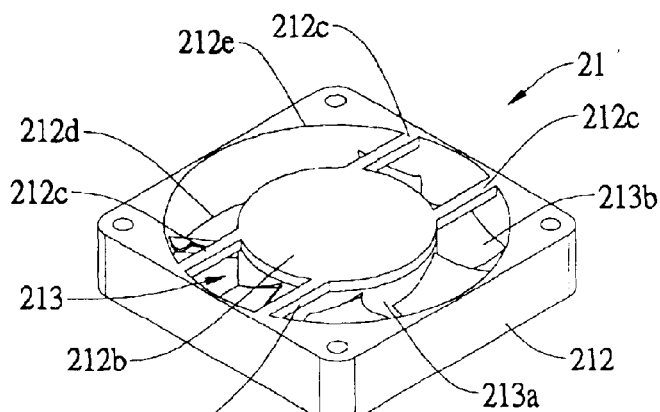
FIG. 7 is a bottom perspective view of the cooling fan of FIG. 5.
Figure 8:
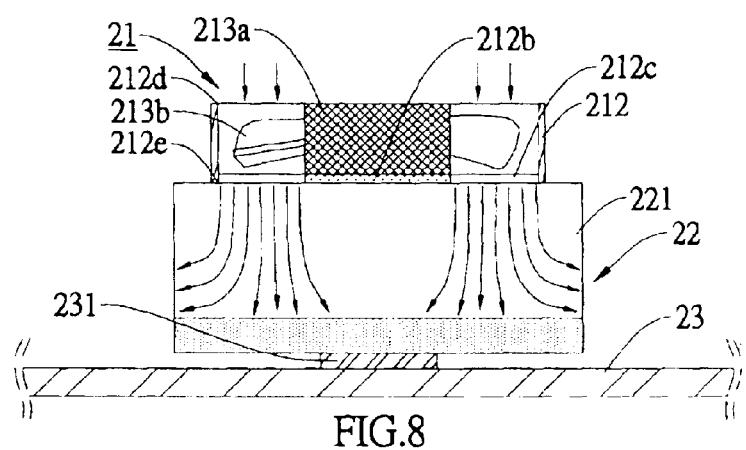
FIG. 8 is a sectional view taken along line B—B of FIG. 6.

Please refer to FIGS. 5, 6, 7, and 8 in which a cooling fan 21 according to a first embodiment of the present invention is shown. As shown, the cooling fan 21 mainly includes a seat 212 having mounting holes 212a provided at predetermined positions thereon, and an air-guiding fan 213 pivotally connected to the seat 212. The seat 212 includes a centered driving section 212b and a plurality of supporting sections 212c extended between the centered driving section 212b and the seat 212. It is noted the supporting sections 212c are extended in parallel with a plurality of parallelly arranged radiation fins 221 of a radiator 22, to a top of which the cooling fan 21 is mounted. The air-guiding fan 213 includes a hub 213a and a plurality of blades 213b generally radially spaced around an outer periphery of the hub 213a. The hub 213a of the air-guiding fan 213 is pivotally connected to the driving section 212b of the seat 212.

The cooling fan 21 is connected to the top of the radiation fins 221 of the radiator 22 by screwing fastening elements 211, such as screws, into the mounting holes 212a on the seat 212. The radiator 22 is then caused to closely bear against a chip 231 mounted on a circuit board 23, and finally assembled to the circuit board 23.

When the driving section 212b drives the air-guiding fan 213 to rotate, air in the space above and surrounding the cooling fan 21 is brought to move into an air inlet 212d of the seat 212 and out of an air outlet 212e of the seat 212. Since the supporting sections 212c are extended in parallel with the radiation fins 221 in the same direction, air is allowed to smoothly pass through the supporting sections 212c when flowing through the air outlet 212e of the seat 212, and fully flows into spaces between the radiation fins 221 of the radiator 22 to provide a largest possible amount of air with lowest possible noise in an air passage defined in the seat 21. The large amount of air flows through the seat 21 to reach at the chip 231 on the circuit board 23 assembled to a bottom side of the radiator 22, and thereby quickly dissipates heat produced by the chip 231.

Figure 9:
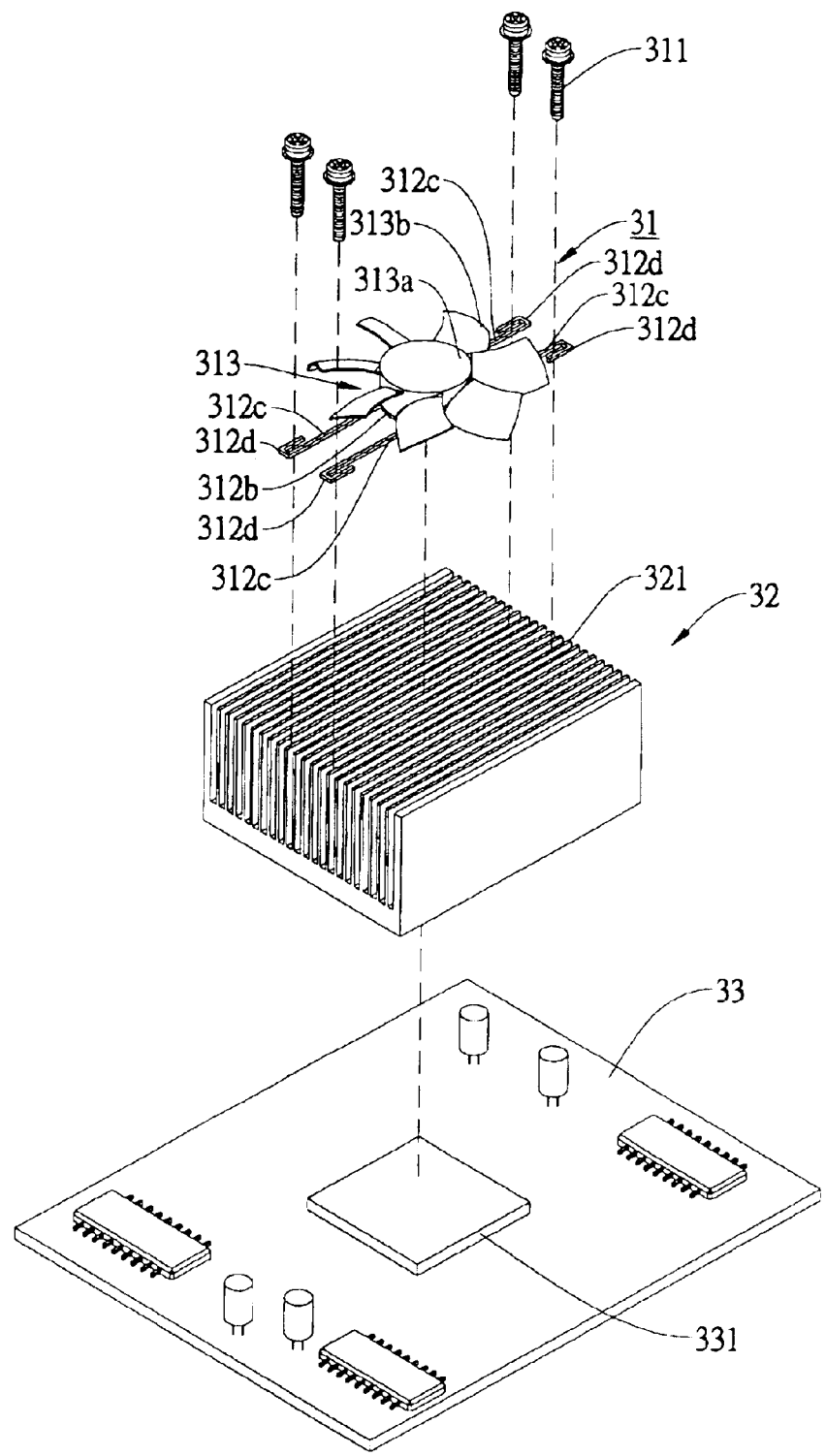
FIG. 9 is an exploded perspective view showing the relation of a cooling fan according to a second embodiment of the present invention with radiation fins and circuit board of a computer.
Figure 10:
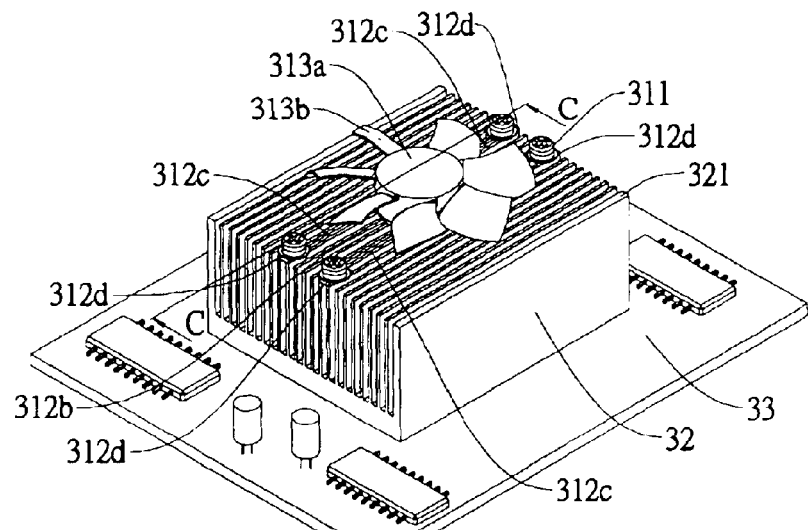
FIG. 10 is an assembled perspective view of FIG. 9.
Figure 11:
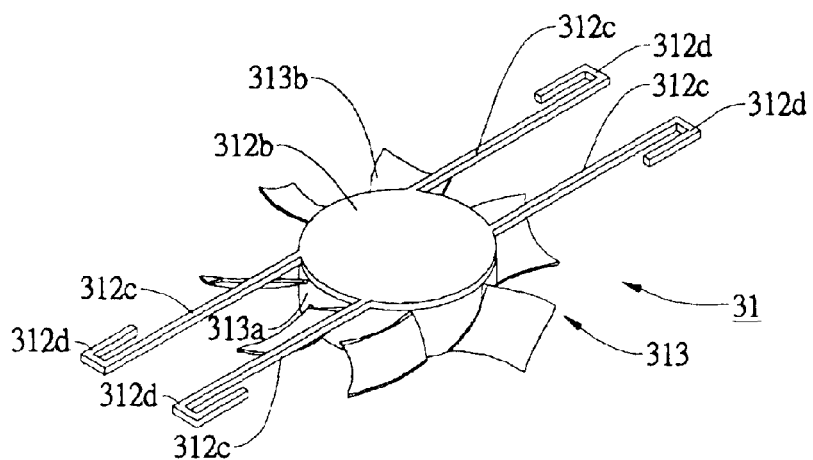
FIG. 11 is a bottom perspective view of the cooling fan of FIG. 9.
Figure 12:
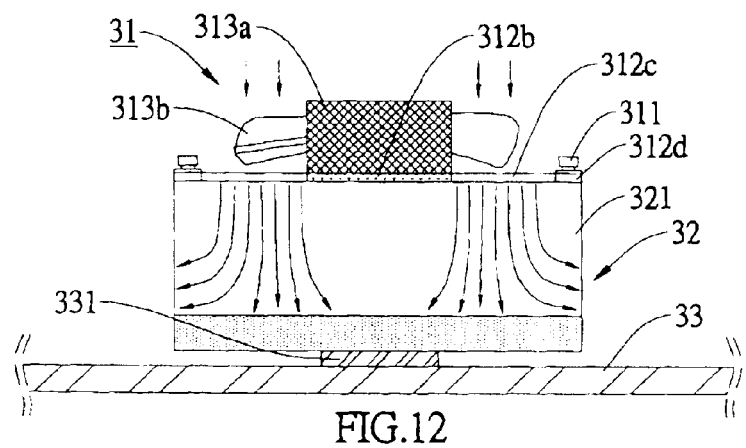
FIG. 12 is a sectional view taken along line C—C of FIG. 10.

FIGS. 9, 10, 11, and 12 illustrates a cooling fan 31 according to a second embodiment of the present invention. The cooling fan 31 is structurally similar to the cooling fan 21 in the first embodiment, and includes a driving section 312b, an air-guiding fan 313 pivotally connected to the driving section 312b, and a plurality of supporting sections 312c separately extended from two opposite sides of the driving section 312b in parallel with parallelly arranged radiation fins 321 of a radiator 32, to a top of which the cooling fan 31 is mounted. The air-guiding fan 313 includes a hub 313a and a plurality of blades 313b generally radially spaced around an outer periphery of the hub 313a. The supporting sections 312c are provided at respective distal end with a mounting section 312d, via which a fastening element 311, such as a screw, may be extended to connect with the radiation fins 321.

After the cooling fan 31 is screwed to the radiation fins 321 of the radiator 32 by extending the fastening elements 311 through the mounting sections 312d, the radiator 32 is caused to closely bear against a chip 331 provided on a circuit board 33 of a computer, and then assembled to the circuit board 33.

When the driving section 312b drives the air-guiding fan 313 to rotate, air in the space above and surrounding the cooling fan 31 is brought to move. Since the supporting sections 312c are extended in parallel with the radiation fins 321 in the same direction, air is allowed to smoothly pass through the supporting sections 312c and fully flows into spaces between the radiation fins 321 of the radiator 32 to provide a largest possible amount of air with lowest possible noise in an air passage defined by the cooling fan 31. The large amount of air reaches at the chip 331 on the circuit board 33 assembled to a bottom side of the radiator 32, and thereby quickly dissipates heat produced by the chip 331.

The present invention has been described with some preferred embodiments thereof and it is understood that many changes and modifications in the described embodiments can be carried out without departing from the scope and the spirit of the invention as defined by the appended claims.

What is claimed is:

1. A cooling fan for mounting on a top of a plurality of parallel radiation fins of a radiator, comprising:

a seat having a driving section, and an air-guiding fan pivotally connected to said driving section of said seat and including a hub and a plurality of blades generally radially spaced around an outer periphery of said hub;

a plurality of supporting sections are extended from two opposite sides of said driving section of said seat so that the supporting sections are in directions parallel with said radiation fins of said radiator, and said driving section is supported by said supporting sections to locate said driving section in said seat and the supporting sections are in direct contact with the radiation fins of said radiator; and whereby when said air-guiding fan is driven by said driving section to rotate and produce flowing air, said supporting sections in parallel with said radiation fins allows the flowing air to flow toward the radiator without hindrance.

2. The cooling fan as claimed in claim 1, wherein said seat is provided at predetermined positions with mounting holes, via which fastening elements are extended to screw said cooling fan to the top of said radiation fins of said radiator.

3. A cooling fan for mounting on a top of a plurality of parallel radiation fins of a radiator, comprising a driving section, an air-guiding fan pivotally connected to said driving section and including a hub and a plurality of blades generally radially spaced around an outer periphery of said hub;

a plurality of supporting sections are extended from two opposite sides of said driving sections so that the supporting sections are in directions parallel with said radiation fins of said radiator and the supporting sections are in direct contact with the radiation fins of said radiator; and whereby when said air-guiding fan is driven by said driving section to rotate and produce flowing air, said supporting sections in parallel with said radiation fins allows the flowing air to flow toward the radiator without hindrance.

4. The cooling fan as claimed in claim 3, wherein said supporting sections are respectively provided at a predetermined position with a mounting section, via which a fastening element is extended to screw said cooling fan to the top of said radiation fins of said radiator.

* * * * *